(12) United States Patent
Tsao et al.

(10) Patent No.: US 12,140,342 B2
(45) Date of Patent: Nov. 12, 2024

(54) MAKEUP AIR HANDLING UNIT IN SEMICONDUCTOR FABRICATION BUILDING AND METHOD FOR CLEANING AIR USING THE SAME

(71) Applicant: TAIWAN SEMICONDUCTOR MANUFACTURING COMPANY LTD., Hsinchu (TW)

(72) Inventors: Chih-Ming Tsao, Miaoli County (TW); Tzu-Sou Chuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 604 days.

(21) Appl. No.: 17/388,482

(22) Filed: Jul. 29, 2021

(65) Prior Publication Data

US 2023/0032454 A1 Feb. 2, 2023

(51) Int. Cl.
*B01D 46/24* (2006.01)
*B01D 46/30* (2006.01)
(Continued)

(52) U.S. Cl.
CPC ........ *F24F 8/108* (2021.01); *H01L 21/67253* (2013.01); *H01L 21/67366* (2013.01);
(Continued)

(58) Field of Classification Search
CPC ........ B01D 46/24; B01D 46/30; B01D 46/62; B01D 46/2403; B01D 2279/50;
(Continued)

(56) References Cited

U.S. PATENT DOCUMENTS 4,941,897 A 7/1990 Vann, III
5,143,612 A 9/1992 Hamanaka et al.
(Continued)

FOREIGN PATENT DOCUMENTS

CN 1220615 A 6/1999
CN 1655832 A 8/2005
(Continued)

OTHER PUBLICATIONS

Office Action, Cited References and Search Report dated Jan. 17, 2024 issued by the China National Intellectual Property Administration for the China Counterpart Application No. 202210145142.1.
(Continued)

*Primary Examiner* — Minh Chau T Pham
(74) *Attorney, Agent, or Firm* — WPAT LAW; Anthony King

(57) ABSTRACT

A semiconductor fabrication building is provided. The semiconductor fabrication building includes an ambient control surrounding and a makeup air handling unit configured to supply clean air to the ambient control surrounding. The makeup air handling unit includes a housing having an air inlet and an air outlet. The makeup air handling unit also includes a first filtration module positioned in the housing. The first filtration module includes a number of hollow fibers configured to guide air to flow from the air inlet to the air outlet. A porous layer is formed at an inner wall of each of the hollow fibers to filter airborne molecular contamination (AMC) having a selected size.

20 Claims, 12 Drawing Sheets

(51) Int. Cl.
*B01D 46/62* (2022.01)
*F24F 3/16* (2021.01)
*F24F 3/167* (2021.01)
*F24F 8/108* (2021.01)
*H01L 21/67* (2006.01)
*H01L 21/673* (2006.01)

(52) U.S. Cl.
CPC .......... *B01D 46/2403* (2013.01); *B01D 46/62* (2022.01); *B01D 2279/50* (2013.01)

(58) Field of Classification Search
CPC ... B01D 69/00; F24F 8/108; F24F 3/16; F24F 3/167; H01L 21/67253; H01L 21/67366
USPC ................. 55/385.1, 385.2, 524; 454/187
See application file for complete search history.

(56) References Cited

U.S. PATENT DOCUMENTS

| | | | |
|---|---|---|---|
| 5,514,196 A | 5/1996 | Tanahashi et al. | |
| 5,772,738 A | 6/1998 | Muraoka | |
| 5,972,060 A * | 10/1999 | O'Halloran | F24F 3/167 55/467 |
| 8,398,755 B2 * | 3/2013 | Coan | B01D 53/228 55/482 |
| 8,414,693 B2 * | 4/2013 | Takagi | B01D 63/021 95/52 |
| 8,465,565 B2 * | 6/2013 | Calis | B01D 46/543 96/12 |
| 2003/0154856 A1 * | 8/2003 | Anderson | B01D 63/0241 55/482 |
| 2005/0039600 A1 | 2/2005 | Lim et al. | |
| 2005/0126393 A1 | 6/2005 | Chen et al. | |
| 2005/0235615 A1 | 10/2005 | Nyman et al. | |
| 2007/0246049 A1 | 10/2007 | Takeda et al. | |
| 2008/0176056 A1 * | 7/2008 | Kilgus | C04B 35/80 428/222 |
| 2012/0151890 A1 * | 6/2012 | Pearson | B01D 63/024 156/60 |
| 2015/0375154 A1 * | 12/2015 | Lai | B01D 46/10 55/467 |
| 2016/0175765 A1 * | 6/2016 | Tai | B01D 53/0462 96/115 |
| 2020/0219744 A1 | 7/2020 | Kim et al. | |

FOREIGN PATENT DOCUMENTS

| | | | |
|---|---|---|---|
| CN | 1893995 A | 1/2007 | |
| CN | 101072620 A | 11/2007 | |
| CN | 206334498 U | 7/2017 | |
| CN | 110047775 A | 7/2019 | |
| CN | 211562395 U | 9/2020 | |
| JP | 2001104758 A | 4/2001 | |
| JP | 2009183927 A | 8/2009 | |
| JP | 2017100105 A | 6/2017 | |
| JP | 2020142191 A | 9/2020 | |
| KR | 101958154 B1 | 3/2019 | |
| SE | 1730271 A1 | 4/2019 | |
| TW | 201121641 A | 7/2011 | |
| TW | 201731579 A | 9/2017 | |
| WO | WO 02/18037 A2 * | 3/2002 | ............. B01D 69/00 |
| WO | 2014047632 A1 | 3/2014 | |
| WO | WO2021027528 A1 | 2/2021 | |

OTHER PUBLICATIONS

"Study on Preparation of Nanometer/Submicron Fiber-based Sandwich Functional Purification Materials", China Academic Journals, Apr. 15, 2018.

Guangxi Dong, Hongyu Li, Vicki Chen, "Factors affect defect-free Matrimid® hollow fiber gas separation performance in natural gas purification", Journal of Membrane Science, vol. 353, Issues 1-2, May 1, 2010, p. 17-27.

* cited by examiner

MAKEUP AIR HANDLING UNIT IN SEMICONDUCTOR FABRICATION BUILDING AND METHOD FOR CLEANING AIR USING THE SAME

BACKGROUND

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, including the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant occupies a relatively larger percentage of the available space for circuit elements on the wafer as compared to wafers containing the larger devices of the past. Moreover, the presence of particles in the integrated circuits compromises the functional integrity of the devices in the finished electronic product.

Therefore, it is desired to provide a makeup air handling unit for controlling an ambient surrounding in a semiconductor fabrication building.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
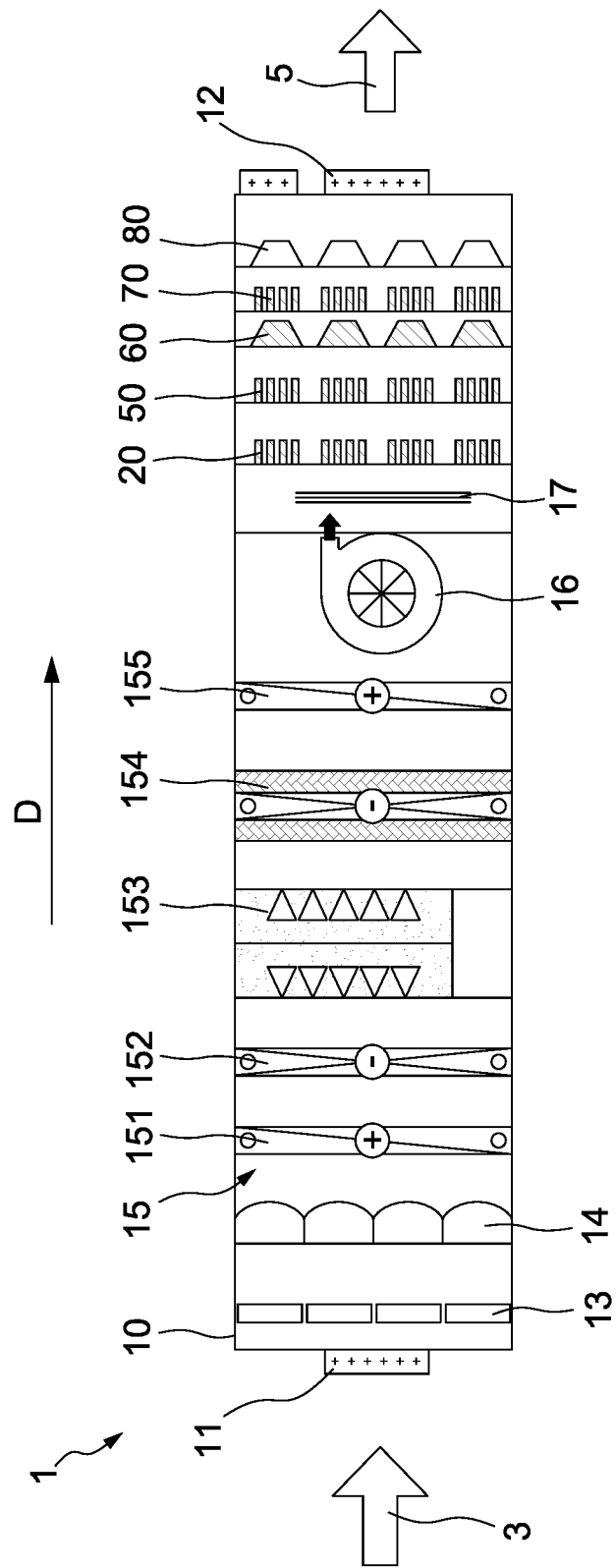
FIG. 1 is a schematic view of a clean room makeup air handling unit in a semiconductor fabrication building, in accordance with some embodiments of present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

According to some embodiments of the present disclosure, a makeup air handling unit is provided to clean outside air for subsequent distribution of the air throughout an ambient control surrounding in a semiconductor fabrication building (FAB). The ambient control surrounding, also known as a cleanroom, is where semiconductor manufacturing is carried out. With the use of the outdoor makeup air handling unit, the cleanroom of the present disclosure is isolated from the outside environment and subjected to stringent controls on contaminants including airborne particles, airborne molecular contamination (AMCs, including violated organic compounds, such as isopropyl alcohol (IPA)/acetone), metals, and electrostatic discharges (ESDs), as well as on such environmental parameters as temperature, relative humidity, oxygen and vibration. The makeup air handling unit utilizes at least one filtration module including at least one hollow fiber having porous layer for firmly capturing unwanted substances in preselected size so as to prevent contamination on semiconductor products.

Please refer FIG. 1, which shows a schematic view of a makeup air handling unit 1, in accordance with some embodiments of present disclosure. According to some embodiments, the makeup air handling unit is a makeup air unit (MAU), and the makeup air handling unit 1 is used to purify air 3 as the air 3 is collected by the system 10 and supply purified air 5 into an ambient control surrounding in a semiconductor fabrication building cleanroom (not shown). In some embodiments, the makeup air handling unit 1 is also used to purify internal particles, which are generated within the cleanroom, in an air stream created by an air return system (not shown). The elements of the makeup air handling unit 1 may be positioned above a celling (not shown) of a cleanroom where fabrication of a semiconductor products takes place. Through openings in the ceiling, the air is drawn downwardly in a continuous laminar flow path from the makeup air handling unit 1, through the cleanroom and into the air return system through openings in the floor.

In one exemplary embodiment of the present disclosure, the makeup air handling unit 1 includes a housing 10, a pre-filter 13, a medium filter 14, an active particle removing module 15, a fan 16, a diffusion grid 17, and a number of filtration modules 20, 50, 60, 70 and 80.

The housing 10 has an elongated shape and extends in an extension direction D. The housing 10 has an air inlet 11 and an air outlet 12. The air inlet 11 and the air outlet 12 may be formed at two opposite ends of the housing 10 in the extension direction D. The pre-filter 13 is typically provided in the housing 10 adjacent to the air inlet 11, and the medium filter 14 is provided downstream of the pre-filter 13. The pre-filter 13 and the medium filter 14 are used to perform a first stage filtration in the makeup air handling unit 1 so as to remove particles larger than a selected size from the air 3.

The active particle removing module 15 is provided downstream of the medium filter 14. In some embodiments, the humidity and temperature control module 15 includes a heating coil 151, a first cooling means 152, a particle removing mechanism 153, a second cooling means 154, a re-heating means 155 arranged in this order. The heating coil 151 and first cooling means 152 are configured to control the temperature of the air flow before it enters the particle removing mechanism 153. The humidity control mechanism 153 is configured to apply water spray over the air flow to remove soluble particles in the air flow and drain away the waste liquid outside the housing 10. The second cooling means 154 and the re-heating means 155 are configured to control the temperature of the air flow after it passes through the particle removing mechanism 153 to a temperature that is desired in the cleanroom.

The fan 16 is provided downstream of the active particle removing module 15. The fan 16 is configured to draw the outside air 3 into the air inlet 11 and then sequentially through the pre-filter 13, the medium filter 14, the active particle removing module 15, the diffusion grid 17, and the filtration modules 20, 50, 60, 70 and 80, and eventually discharged the purified air by the air outlet 12. The diffusion grid 17 is provided downstream of the fan 16. The diffusion grid 17 is configured to evenly supply the air from the fan 16 to the first filtration module 20 that is immediately adjacent to the diffusion grid 17. The diffusion grid 17 may be constructed so as to transform laminar flow of an air stream into turbulent flow of the air stream. For example, multiple protrusions having triangle cross section are formed in a channel of the diffusion grid 17. The functions of the turbulence movement of the air stream will be described with reference to embodiments shown in FIGS. 6-8.

The filtration modules 20, 50, 60, 70 and 80 are sequentially provided downstream of the diffusion grid 17. In some embodiments, each of the filtration modules 20, 50, 60, 70 and 80 is configured to separate different substances from the air stream in the housing 10. According to the present disclosure, the filtration module 20 is configured to filter substance having the number of carbon atoms less than 5, such as methane, methanol (MeOH), isopropyl alcohol (IPA), acetone, n-butane, n-methyl-2-pyrrolidone (NMP), propylene glycol methyl ether (PGME), ethyl acetate. The filtration module 50 is configured to filter substances such like dimethyl sulfide (DMS), the filtration module 60 is configured to filter substances such like $NH_3$, the filtration module 70 including active-carbon based filter is configured to filter substances such like total organic carbon (TOC) including the number of carbon atoms greater than or equal to 5, the filtration module 80 includes a high efficiency particulate air (HEPA) filter and is configured to remove about 99.97% of the airborne particles from the air flowing therethrough.

It will be appreciated that the disclosure is not limited to the particular order of the filtration modules, the arrangement of the filtration module may be varied to achieve a higher filter efficiency. Furthermore, one or more of the filtration modules may be omitted or increased in number. In cases where the number of filtration modules having the same function is more than two, these filtration modules can be arranged in sequence or arranged separately, i.e., one or more filtration modules having different functions are positioned therebetween. For purpose of illustration, the filtration module 20 is also referred to as first filtration module, and the filtration module 70 is also referred to as second filtration module in the descriptions hereinafter.

Figure 2:
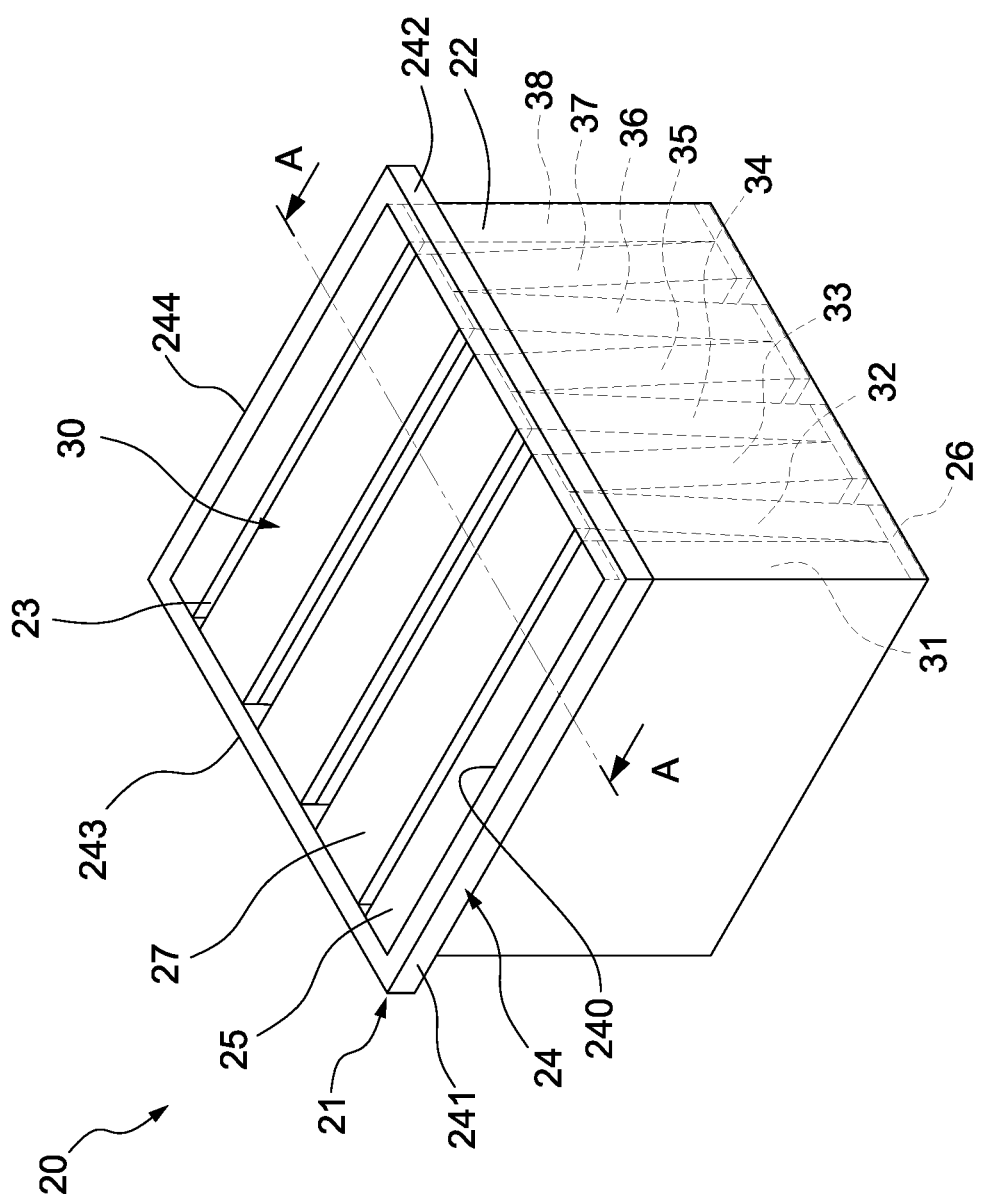
FIG. 2 is a schematic view of a filtration module inside makeup air handling unit, in accordance with some embodiments of present disclosure.
Figure 3:
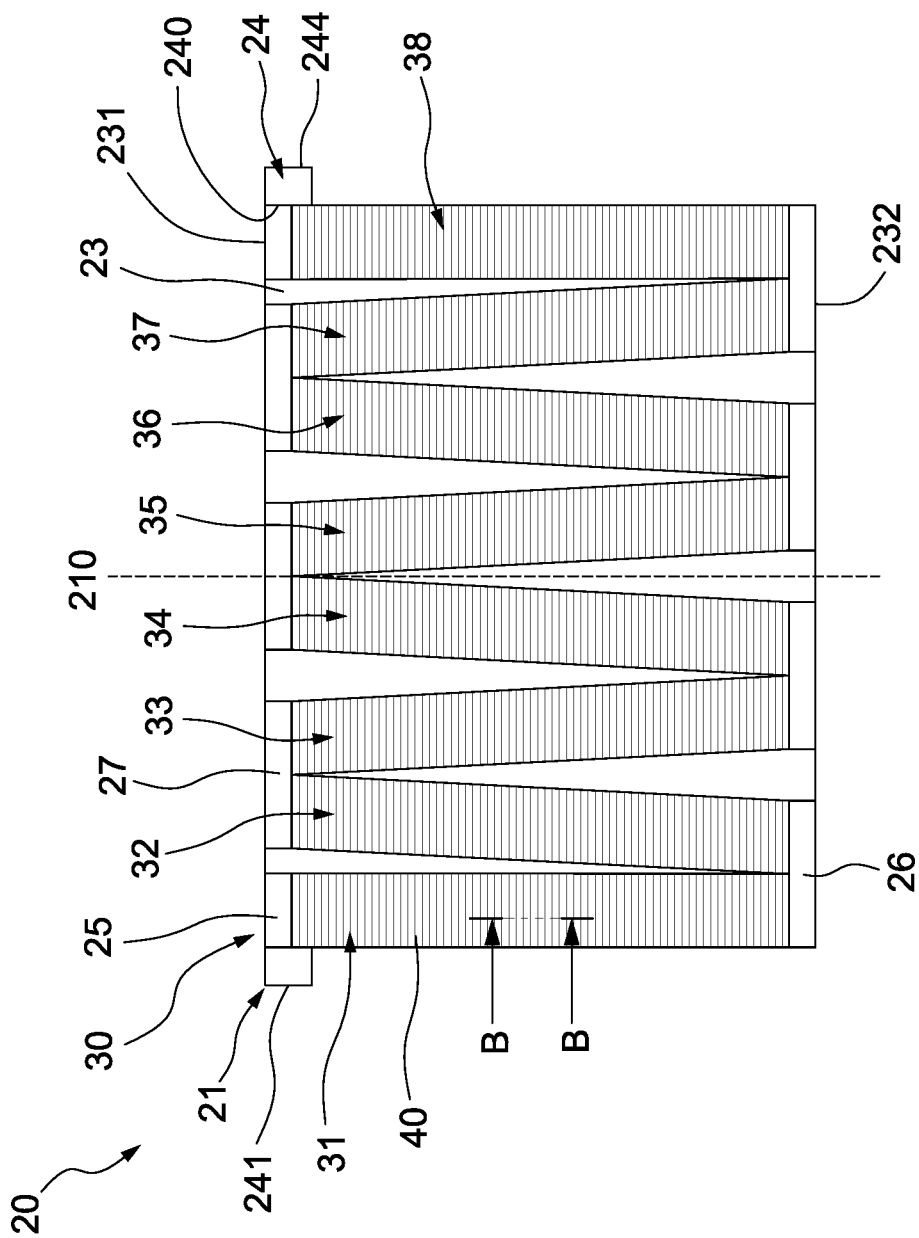
FIG. 3 is a cross-sectional view of partial elements of the filtration module taken along line A-A in FIG. 2.

FIG. 2 is a schematic view of the first filtration module 20, in accordance with some embodiments of present disclosure, and FIG. 3 is a cross-sectional view of partial elements of the first filtration module 20 taken along line A-A in FIG. 2. In some embodiments, the first filtration module 20 includes a casing 21 and a filtration member 30 positioned in the casing 21. The casing 21 includes two side walls 22 and 23 and a front frame 24. The side walls 22 and 23 face each other and located at two sides of a main axis 210 that passes through a center of the casing 21. In some embodiments, the side wall 22 is parallel to the side wall 23, and the main axis 210 is parallel to the extension direction D (FIG. 1) of the housing 10. As a result, the side walls 22 and 23 are parallel to the extension direction D of the housing 10.

The front frame 24 has a rectangular shape and defines an opening 240 for the intake of the air stream supplied from the fan 16. The front frame 24 has two opposite side portions 242 and 243 that are connected to front edges of the side walls 22 and 23. The other two sides of the casing 21 corresponding to two side portions 241 and 244 of the front frame 24 that are not connected to the side walls and exposed to the interior of the housing 10 (FIG. 1). The rear side of the casing 21, opposite to the top side where the front frame 24 is disposed, is also exposed to the interior of the housing 10 (FIG. 1).

The filtration member 30 is configured to filter residues or substances in the air flow as it passing through the first filtration module 20. In some embodiments, as shown in FIG. 3, the filtration member 30 is positioned in the casing 21 and includes a number of filter panels, such as filter panels 31-38. The filter panels 31-38 are positioned between the side walls 22 and 23 of the casing 21. The filter panels 31 and 38 are respectively immediately adjacent to the side portions 241 and 244 of the front frame 24. The remaining filter panels 32-37 are sequentially arranged between the filter panels 31 and 38. In the present exemplary embodiment, the filter panels 31 and 38 are perpendicular to the front edge 231 and the rear edge 232 of the side wall 23, and the filter panels 32-37 are inclined relative to the front edge 231 of the side wall 23. However it will be appreciated that many variations and modifications can be made to embodiments of the disclosure. In some other embodiments, the filter panels 31 and 38 are inclined relative to the front edge 231 of the side wall 23. Thus, there are four pairs of the filter panels arranged in the casing 21 and, as observed along a direction that is perpendicular to the side wall 23, the filter panels forms a number of V-shaped cross sections with the same intersection angle.

In some embodiments, the front ends and the rear ends of the filter panels 31-38 are covered with a fixture element, such as fixture elements 25, 26 and 27. The fixture elements 25, 26 and 27 is not only configured to enhance the structural strength of each of the filter panels 31-38 but also facilitate the connection of two of the filter panels 31 and 38 that are positioned adjacent to one another. The fixture elements may include a number of metal sheets.

In some embodiments, as shown in FIG. 3, each of the filter panels 31-38 includes a number of hollow fibers 40 arranged in a plane. The hollow fibers 40 extend in a thickness direction of the respect filter panels 31-38 for a length. As a result, the hollow fibers 40 in the respective filter panels 31-38 are perpendicular to a plane in which the respective filters panel extend. The hollow fibers 40 in each one of the filter panels 31-38 are bonded by a bonding material 39, such as emulsion adhesives consist of a mixture of an acrylic polymer, surfactant(s) and other additives. In cases where the filter panels, such as filter panels 32-37, are positioned inclined relative to the front edge 231 of the side wall 23, a longitudinal direction of the hollow fibers 40 in these filter panels 31-38 are inclined relative to the main axis 201 of the casing 21 and inclined relative to the extension direction D (FIG. 1) of the housing 10.

Figure 4:
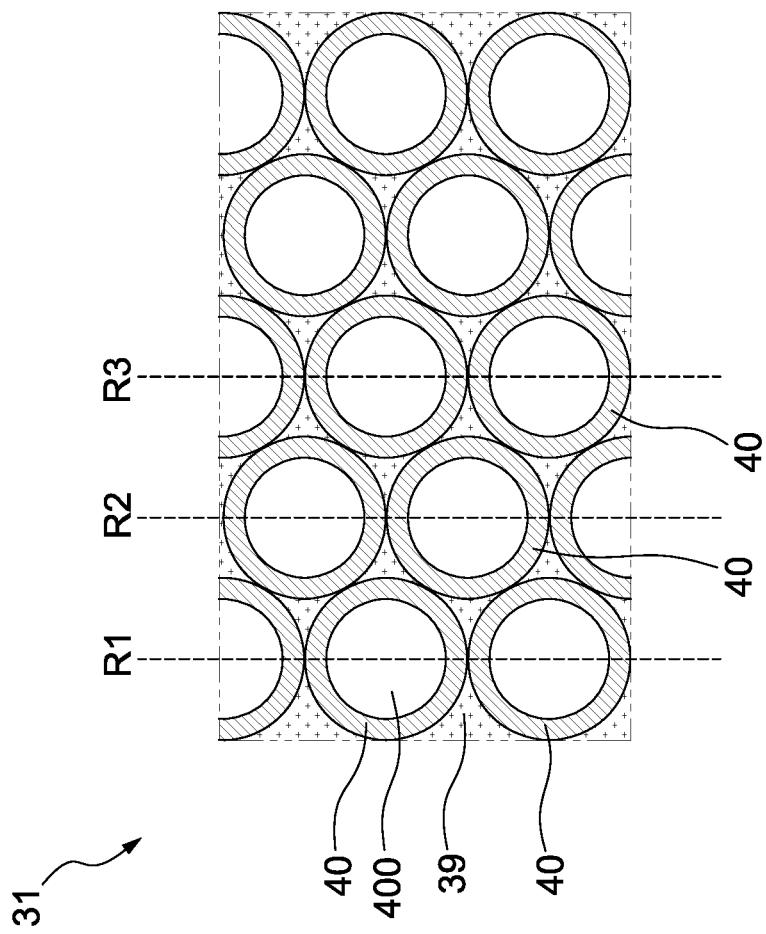
FIG. 4 is a cross-sectional view of partial elements of a filter panel taken along line B-B in FIG. 3.

Structural features of the hollow fibers 40, in accordance with one exemplary embodiment of the present disclosure are described in details below. As shown in FIG. 4, each of the hollow fibers 40 is formed with a tubular shape with a gas channel 400 extending in a longitudinal axis of a cylinder. The hollow fibers 40 in the same filter panel may be arranged in a matrix and are bonded together through the bonding material 39. In some embodiments, in order to increase the number of gas channel 400 per unit area of the filter panel, the hollow fibers 40 arranged in one row are offset from the hollow fibers 40 arranged in another adjacent row. For example, as shown in FIG. 4, the hollow fibers 40 are arranged in a first row R1, a second row R2 and a third row R3. The hollow fibers 40 arranged in the first row R1 are offset from the hollow fibers 40 arranged in the second row R2, and the hollow fibers 40 arranged in the second row R2 are offset from the hollow fibers 40 arranged in the third row R3. The center of the each of the hollow fibers 40 in the second row R2 may align with a point at which two neighboring hollow fibers in the first row R1 or the third row R3 are contacted with one another. The inner diameter of the hollow fiber 40 may be about 0.1 mm to about 10 mm, and a distance between centers of two hollow fibers 40 may be about 0.5 mm to about 2.5 mm. The hollow fibers 40 in the filter panels 32-38 may have similar configurations as that in the filter panel 31 and details thereof are omitted for the sake of brevity.

Figure 5:
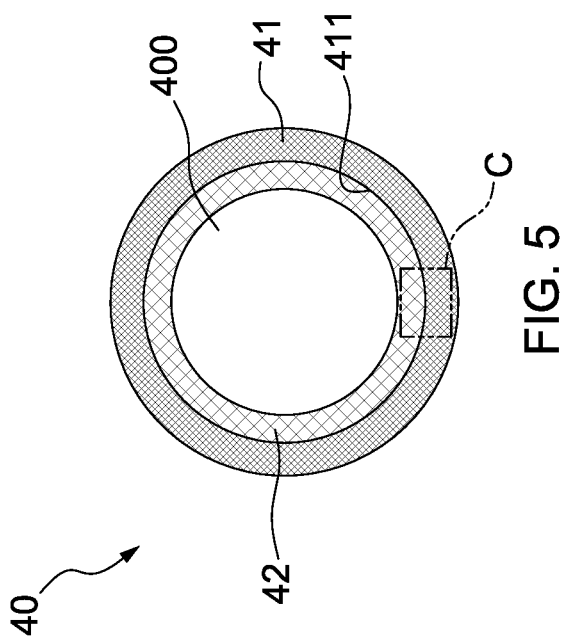
FIG. 5 is a cross-sectional view of a hollow fiber, in accordance with some embodiments of present disclosure.

FIG. 5 is a cross-sectional view of a hollow fiber 40, in accordance with some embodiments of present disclosure. In some embodiments, each of the hollow fiber 40 includes a tubular body 41 with a gas channel 400 formed therein. The gas channel 400 has two openings formed at two ends of the hollow fiber 40 to guide the air flow to pass through the hollow fiber 40. In some embodiments, the tubular body 41 is made of polymer selected from the group consisting of polyethersulfone (PESF), polysulfone (PSF), polyphenylsulfone (PPSU), polyvinylidene fluoride (PVDF), polyacrylonitrile, polyimide (PI), cellulose acetate, cellulose diacetate, polyetherimide, polylactic acid, polyamide, polyvinyl acetate, polyglycolic acid, poly(lactic-co-glycolic acid), ethylene vinyl alcohol (EVOH), polycaprolactone, polyvinyl pyrrolidone, cellulose acetate (CA), and polydimethylsiloxane, polytetrafluoroethylene.

Figure 6:
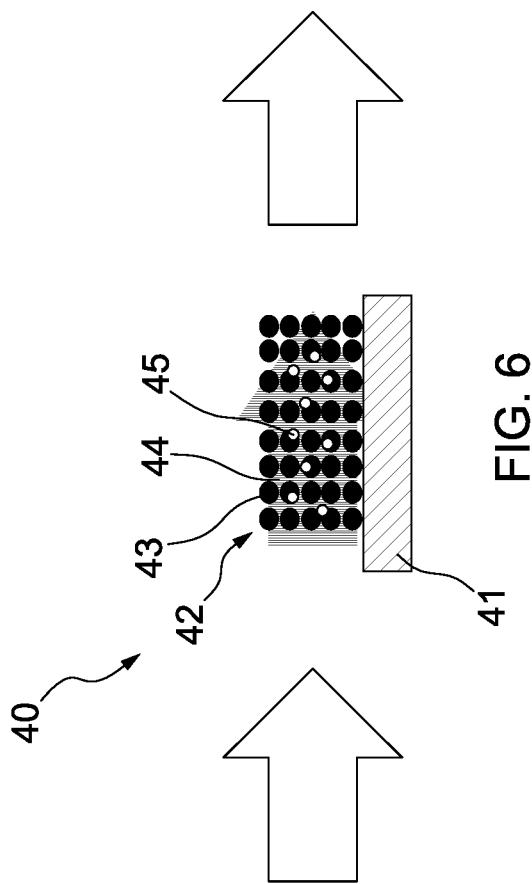
FIG. 6 is an enlarged view of a region "C" in FIG. 5 while an air flow passes through a porous layer of the hollow fiber, in accordance with some embodiments of present disclosure.

The hollow fiber 40 further includes a porous layer 42 formed at an inner wall defined in the gas channel 400 of the tubular body 41. The porous layer 42 may include a molecular sieves which is formed by mixing and heating the raw materials including aluminates (e.g., $NaAlO_2$, $Al_2O_3$, etc.), silicon-containing compounds ($Na_2SiO_3$, $SiO_2$, etc.), and bases (e.g., sodium hydroxide, potassium hydroxide, etc.) in an appropriate ratio to form zeolite. After the formation of the porous layer 42, as shown in FIG. 6, the lattice structure 43 of the porous layer 42 has a number of pores 44 formed therein. The lattice structure 43 may include multiple stacked layers 45, each of which includes a lattice of material. In one exemplary embodiment, the porous layers 42 is formed of zeolite having a chemical formula of ¾ $CaO·¼ Na_2O·Al_2O_3·2SiO_2·9/2H_2O$, which has a mean pore size ranged from about 5 angstroms to about 6 angstroms. Alternatively, the porous layers 42 is formed of zeolite having a chemical formula of $Na_2O·Al_2O_3·2SiO_2·9/2H_2O$, which has a mean pore size ranged from about 4 angstroms.

In some other embodiments, each of the tubular body 41 and the porous layer 42 includes fibers made of aluminum silicate ($Al_2O_3·SiO_2$). The fibers in tubular body 41 and the porous layer 42 have the same diameter, but the tubular body 41 is denser than the porous layer 42. For example, the density of the fiber distribution in the tubular body 41 is two orders different from that in the porous layer 42, i.e., about hundreds of times.

Figure 7:
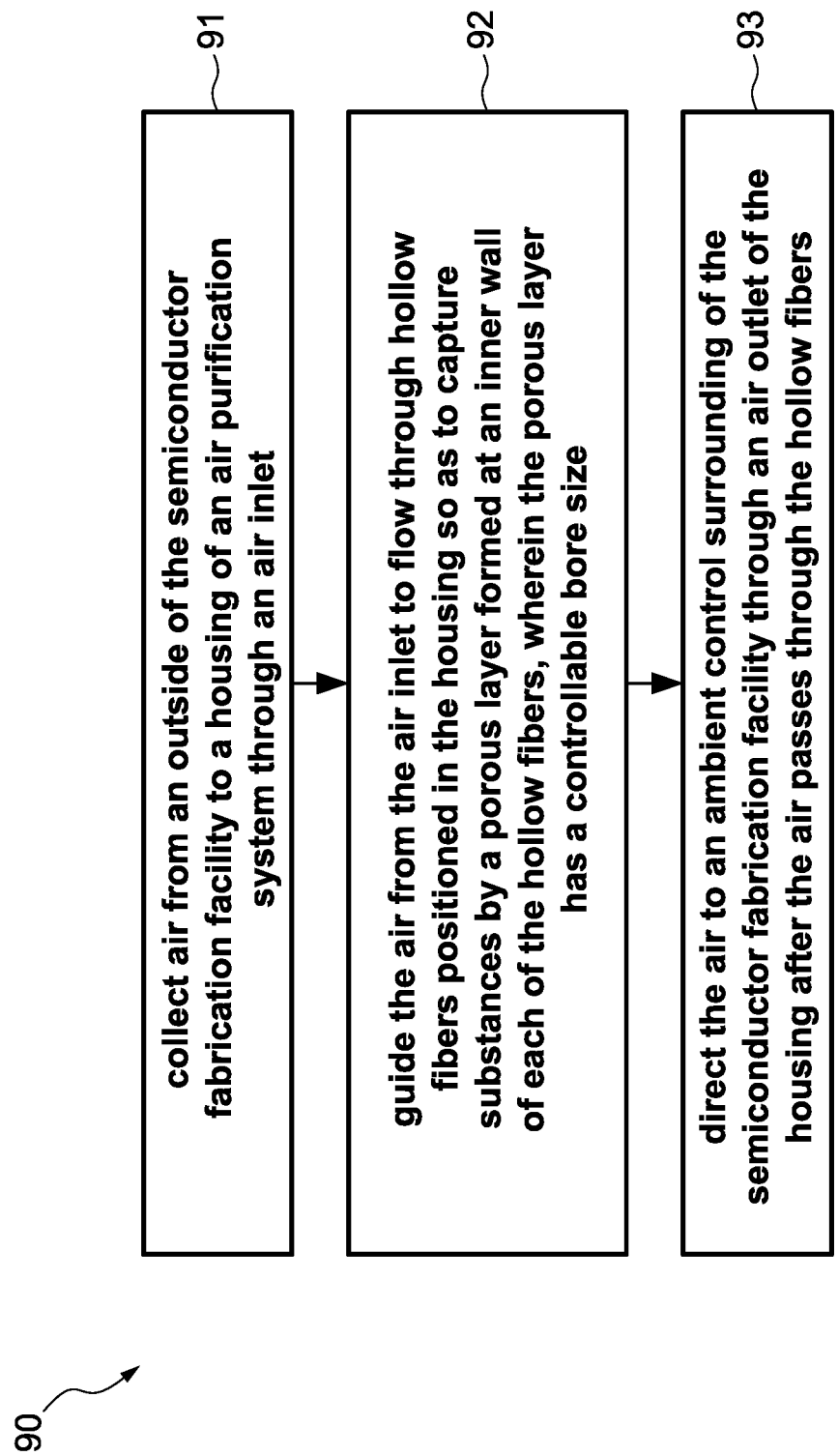
FIG. 7 is a flow chat of a method for purifying makeup air from outdoor in a semiconductor fabrication building, in accordance with some embodiments of present disclosure.

FIG. 7 is a simplified flowchart of a method 90 of purifying air in a semiconductor fabrication building, in accordance with some embodiments. For illustration, the flow chart will be described along with the drawings shown in FIGS. 1-6. Some of the described stages can be replaced or eliminated in different embodiments.

The method 90 includes operation 91, in which air is collected from an outside of the semiconductor fabrication building to the housing 10 of the air purification system 1 through the air inlet 11. In some embodiments, the fan 16 draws the air outside of the fab into the housing 10 through the air inlet 11, after which the air flows initially through the pre-filter 13 and the medium filter 14 and then through the cooling coil 152. The pre-filter 13 and the medium filter 14 remove particles larger than a selected size from the air. As it passes through the cooling coil 152, the air is cooled to a temperature at or below the dew point. Simultaneously, the air is flushed with water spray droplets generated by the particle removing mechanism 153. These water spray droplets bind to airborne particles in the flowing air and eventually pulled by gravity down to a drain trap (not shown), which is periodically emptied to remove the collected particles therefrom.

In some embodiments, having passed through the particle removing mechanism 153, the air is devoid of all or a substantially large quantity of the airborne particles that were present therein upon entry of the air into the air inlet 11 of the housing 10. The air next flows through the re-heating means 155, which raises the temperature of the air to about room temperature.

The method 90 also includes operation 92, in which the air from the air inlet 11 is guided to flow through hollow fibers 40 positioned in the housing 10 so as to capture substances by the porous layer 42 formed at the inner wall 411 of each of the hollow fibers 40. In some embodiments, before exiting the air outlet 12 of the housing 10, the air is guided to pass through the filtration modules 20, 50, 60, 70 and 80 to remove any chemical residues remaining in the air. When the air flows into the first filtration module 20, the air enters the opening 240 of the filtration module 20 and then sequentially passes through the hollow fibers 40 in the filter panels 31-38.

As shown in FIG. 6, when the air migrates through the porous layer 42 of the hollow fibers 40, molecules that has similar size to the pore diameters in the porous layer 42 enters the porous layer 42 and is adsorbed, while the substance that has larger molecules cannot enter the porous layer 42 or adsorbed by the porous layer 42. It is known that the number of carbon atoms can be considered as the size of a molecules. Therefore, in cases where the pore size of the porous layer 42 is in a range from about 5 angstroms to about 6 angstroms, substance having a relative smaller size, for example substance with the number of carbon atoms being less than 5 is captured by the porous layer 42. The substances, for example, may include methane, methanol (MeOH), isopropyl alcohol (IPA), acetone, n-butane, n-methyl-2-pyrrolidone (NMP), propylene glycol methyl ether (PGME), and ethyl acetate.

Figure 8:
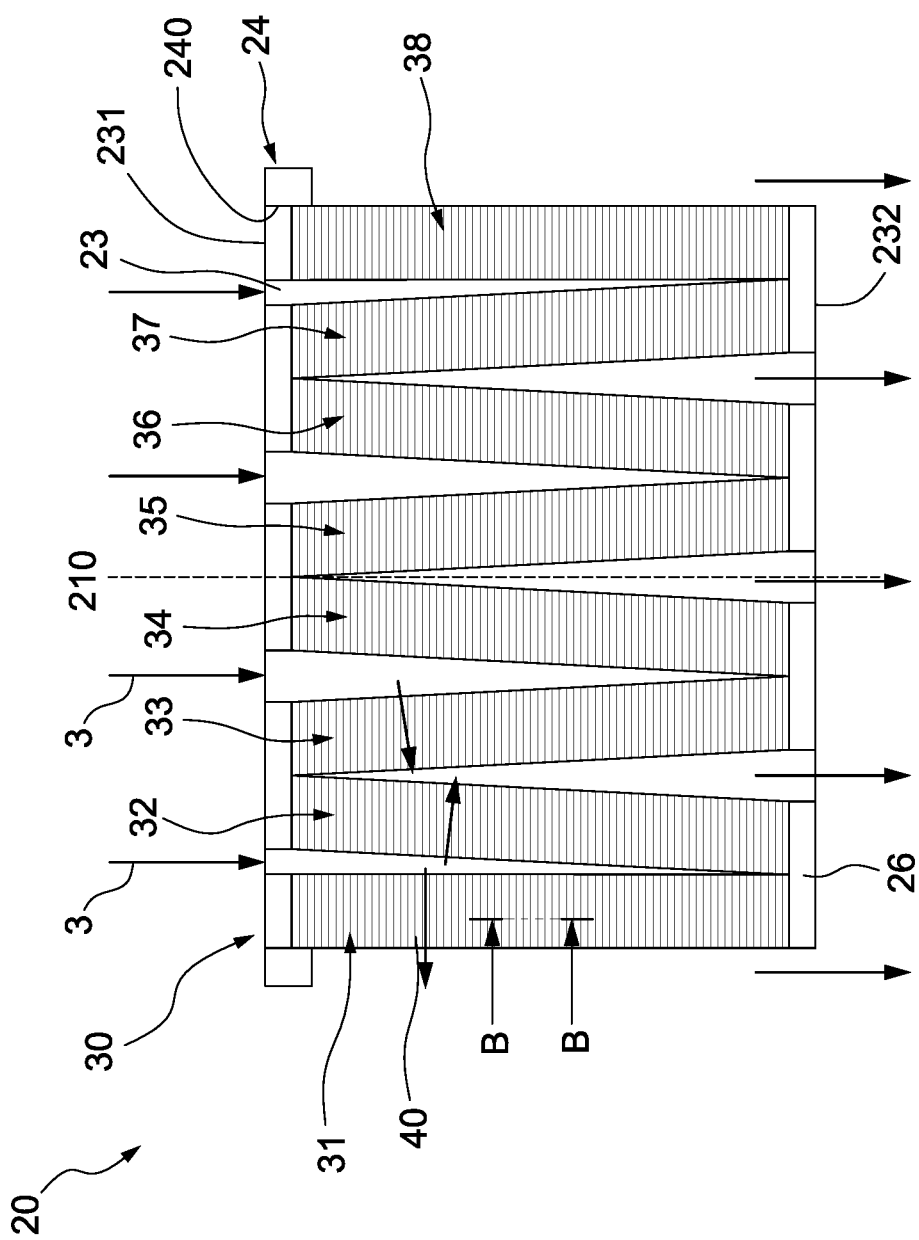
FIG. 8 is a cross-sectional view showing a stage of the method for purifying air in a semiconductor fabrication building as air flow passing through a filtration module, in accordance with some embodiments of present disclosure.

In some embodiments, as shown in FIG. 8, since the filter panels 31 and 38 are perpendicular to the front edge 231 of the side wall 23, and since the filter panels 32-37 are inclined relative to the front edge 231 of the side wall 23, when the air 3 passes through the filter panels 31-38, the flowing direction of the air is changed to be inclined relative to or perpendicular to the main axis 210 of the casing 21. As a result, the flowing rate of the air stream is slowed down, and a period of time during which the air passes through the hollow fibers 40 is increased, whereby improving the filter efficiency.

In some embodiments, the first filtration module 20 is positioned immediately adjacent to the diffusion grid 17. Therefore, before the air enters the first filtration module 20, a turbulence movement of the air flow is generated, which may further increase the period of time during which the air passes through the hollow fibers 40. In addition, the turbulent flow may also cause the air flow passing through different regions of the porous layer 42 in the gas channel 400, which may advantageously prolong the life time of the filtration module 20 and therefore reduce the cost for maintaining the makeup air handling unit 1.

The method 90 further includes operation 93, the air is directed to an ambient control surrounding of the semiconductor fabrication building through the air outlet 12 of the housing 10 after the air passes through the filtration modules 20, 50, 60, 70 and 80. In some embodiments, the filtration modules 20, 50, 60, 70 and 80 remove any remaining particles larger than a selected size from the air. Accordingly, the air emerges from the air outlet 12 of the housing 10 as purified air 5 which meets or exceeds the cleanroom standards for air purity. For example, airborne molecular contamination (AMC) specification in some sensitive process zone in advanced process, TOC concentration in makeup air is not excess 10 ug/$Nm^3$. Finally, the purified air 5 emerges from the air outlet 12 of the housing 10 and enters the cleanroom of the facility through a suitable air distribution system (not shown).

Figure 9:
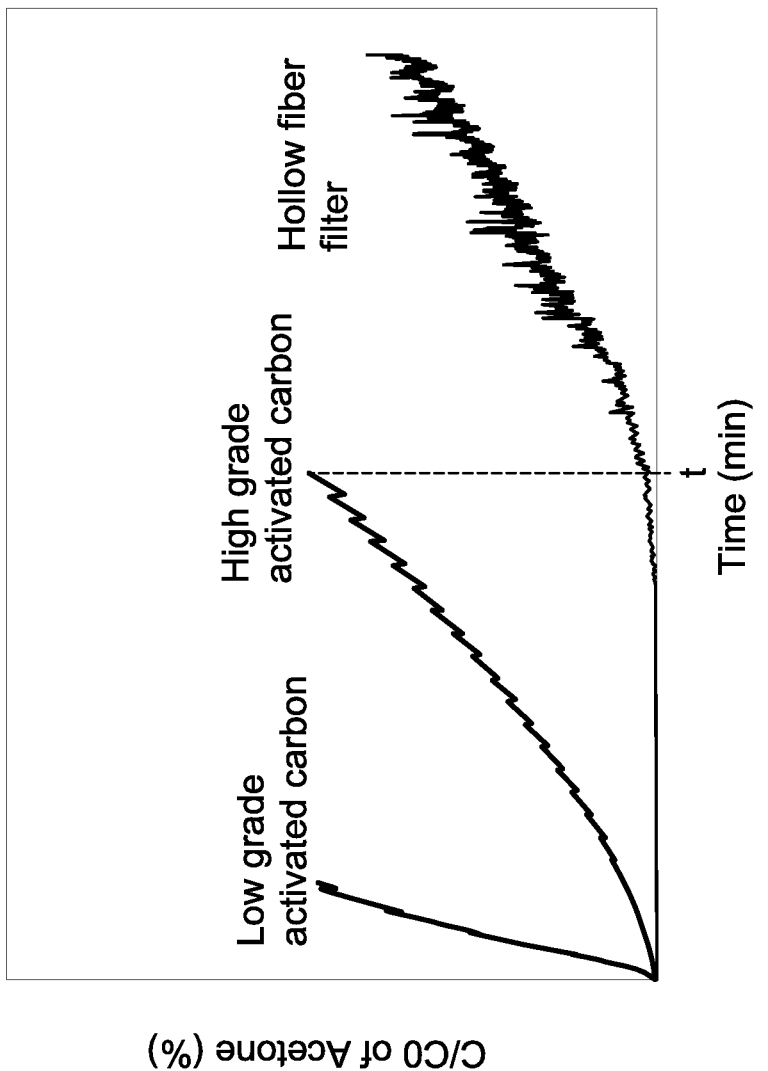
FIG. 9 is a diagram showing a filtration efficiencies of different filtration material including a filtration module according to embodiments of the present disclosure versus times.

FIG. 9 shows the filtration efficiency of a filtration module with different filtration media, where C0 is a concentration of acetone at an inlet of the filtration module and C is a concentration of acetone at an outlet of the filtration module. It has been found that the filtration module including hollow fibers, such as filtration module 20 shown in FIG. 2, exhibits a good filtration efficiency before time t, while the filtration module including low grade active carbon or high grade active carbon are failed before time t because a ratio of the measurements C/C0 exceed a factory set limit. Therefore, it would be expected a longer frequency of filter replacement for the filtration module 20 as compared with the filtration modules including low grade active carbon or high grade active carbon. According to one experimental result, when the air flow rate is about 3,333 $m^3$/hour, holding period for hollow fiber type filter is 9.28 times in compare with low grade activated carbon filter under 75% acetone removal efficiency, and hollow fiber type filter has an equilibrium adsorption capacity that is 10.55 times than low grade activated carbon filter.

In some embodiments, the makeup air handling unit 1 utilizes hollow fibers and the high grade active carbon at the same time to eliminate carbon containing particles having different sizes at two positions in an air flowing path in the makeup air handling unit 1. For example, as shown in FIG. 1, the makeup air handling unit 1 utilizes hollow fibers in the first filtration module 20 and also utilizes high grade active carbon in the second filtration module 70. The first filtration module 20 is provided upstream of the second filtration module 70. The first filtration module 20 is configured to filter substances having the number of carbon atoms less than 5, and the second filtration module 70 is configured to filter substances having the number of carbon atoms equal to or greater than 5.

It will be appreciated that while the filtration module including the hollow fibers is provided upstream of the filtration module including high grade active carbon, the positions of these two filtration modules can be exchanged. In such case, since the high grade active carbon filter has pore sizes ranging from about 100 angstroms to about 400 angstroms, AMC having smaller size (C<5), such like IPA/acetone, can be captured by the high grade active carbon. In some embodiments, due to a substitution effect, the small molecules may be released from the high grade active carbon filter after such filter is used for a period of time. However, these small molecules released from the high grade active carbon filter can be tightly captured by hollow fiber type filter located downstream.

In some embodiments, the method 90 may further include performing a regeneration process for the hollow fibers to maintain the adsorption properties of the hollow fibers. The regeneration process may include, for example, applying a heated gas stream through the hollow fibers in an oven or using heaters. Since the filtration module including hollow fibers can be regenerated, an environmental impact can be avoid due to the reducing of solid waste.

The configuration of the filtration module including the hollow fibers should not be limited to the embodiments above. Some exemplary embodiments of the hollow fiber filtration module are described below.

Figure 10:
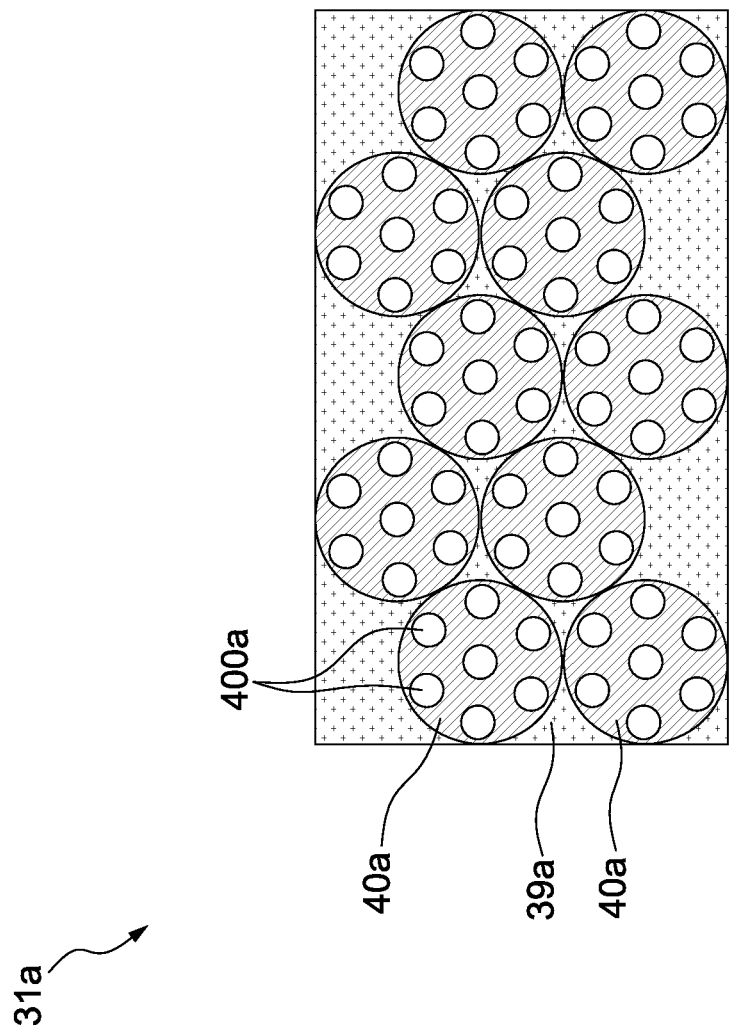
FIG. 10 is a cross-sectional view of partial elements of a filtration module, in accordance with some embodiments of present disclosure.

FIG. 10 is a cross-sectional view of a filter panel 31a of a filtration module, in accordance with some embodiments of present disclosure. In some embodiments, the filter panel 31a includes a number of hollow fibers 40a arranged in a matrix and are bonded together through the bonding material 39a. Each of the hollow fibers 40a has multiple gas channels 400a, for example 7 gas channels. In some embodiments, the hollow fiber 40a has a cylindrical shape and as a whole is made of porous material, such as aluminum silicate, zeolite, or the like, which has a mean pore size ranged from about 5 angstroms to about 6 angstroms. In one exemplary embodiment, the zeolite has a chemical formula of $¾ CaO·¼ Na_2O·Al_2O_3·2SiO_2·9/2H_2O$. Therefore, each of inner walls of the hollow fibers 40a in the gas channels 400a are formed with a porous layer. When the air migrates through the gas channels 400a, substances with the number of carbon atoms being less than 5 is captured by the porous layer. The multiple channel type hollow fibers as shown in FIG. 10 may improve the filter efficiency by increasing a period of time during which the air passes through the hollow fibers 40a.

Figure 11:
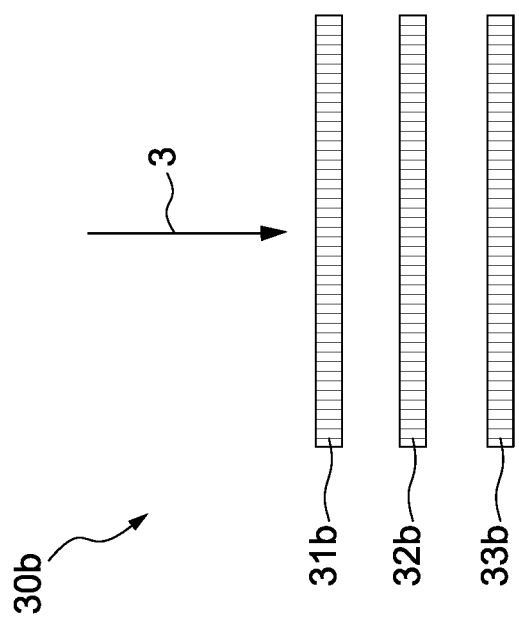
FIG. 11 is a cross-sectional view of a filter assembly with multiple filter panels arranged in an axis, in accordance with some embodiments of present disclosure.

FIG. 11 shows an embodiment of a filtration member 30b which includes a number of filter panels 31b, 32b and 33b. Each of the filter panels 31b, 32b and 33b includes a number of hollow fibers as those in the filter panel 31 shown in FIG. 4 or as those in the filter panels 31a shown in FIG. 10. The filter panels 31b, 32b and 33b extends perpendicular to an air flowing direction as the air 3 entering the filtration member 30b. In operation, the air 3 is filtered by the filter panels 31b, 32b and 33b in sequence.

In some embodiments, the porous layer in the respect filter panels 31b, 32b and 33b has a uniform pore size, but has a pore size different from that in another one of the filter panels 31b, 32b and 33b. For example, the filter panel 31a includes porous layer having a first pore size, the filter panel 31b includes porous layer having a second pore size, and the filter panel 31c includes porous layer having a third pore size. The first pore size is smaller than the second pore size, and the second pore size is smaller than the third pore size.

Figure 12:
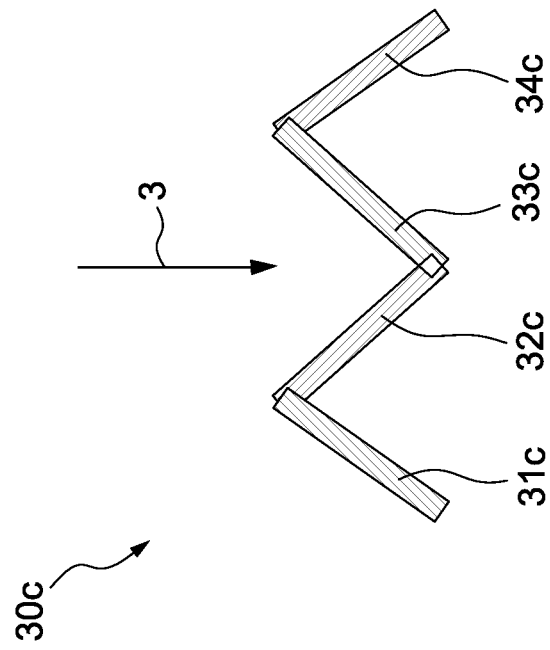
FIG. 12 is a cross-sectional view of a filter assembly with multiple filter panels arranged in a V-shaped fashion, in accordance with some embodiments of present disclosure.

FIG. 12 shows an embodiment of a filtration member 30c which includes a number of filter panels 31c, 32c, 33c and 34c, each including a number of hollow fibers as those in the filter panel 31 shown in FIG. 4 or as those in the filter panels 31a shown in FIG. 10. In some embodiments, the filtration member 30c is positioned in the casing 21 as shown in FIGS. 2 and 3, and as observed along a direction that is perpendicular to the side wall 23, each pair of the filter panels 31c, 32c and the filter panels 33c and 34c has a V-shaped cross section with the same intersection angle.

Figure 13:
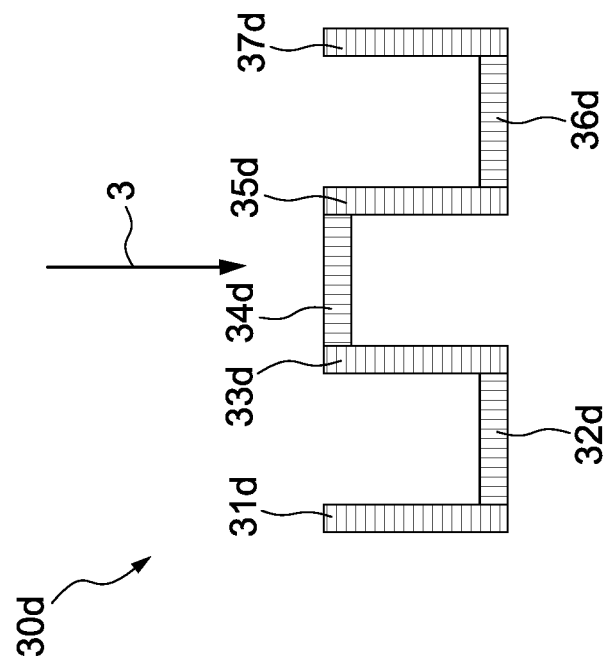
FIG. 13 is a cross-sectional view of a filter assembly with multiple filter panels arranged in a U-shaped fashion, in accordance with some embodiments of present disclosure.

FIG. 13 shows an embodiment of a filtration member 30d which includes a number of filter panels 31d, 32d, 33d, 34d, 35d, 36d, 37d, each including a number of hollow fibers as those in the filter panel 31 shown in FIG. 4 or as those in the filter panels 31a shown in FIG. 10. In some embodiments, the filtration member 30d is positioned in the casing 21 as shown in FIGS. 2 and 3, and as observed along a direction that is perpendicular to the side wall 23, the filter panels 31d, 32d, 33d and the filter panels 35d, 36d, 37d form a U-shaped cross section, and the filter panel 34d is connected between the filter panel 33d and the filter panel 35d.

Figure 14:
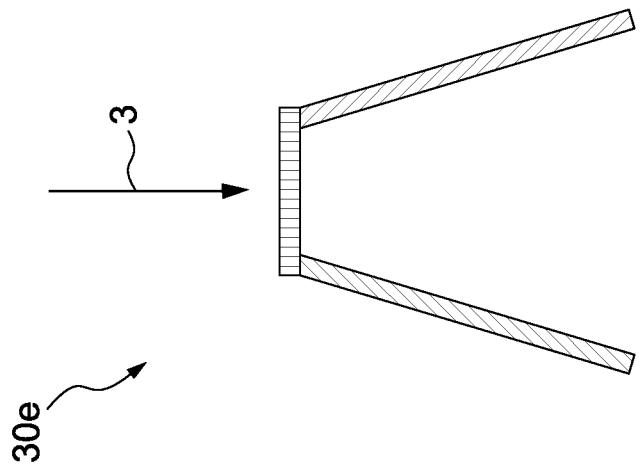
FIG. 14 is a cross-sectional view of a filter assembly with multiple filter panels arranged in an arc-shaped fashion, in accordance with some embodiments of present disclosure.

FIG. 14 shows an embodiment of a filtration member 30e which includes a number of filter panels 31e, 32e and 33e, each including a number of hollow fibers as those in the filter panel 31 shown in FIG. 4 or as those in the filter panels 31a shown in FIG. 10. In some embodiments, the filtration member 30e is positioned in the casing 21 as shown in FIGS. 2 and 3, and as observed along a direction that is perpendicular to the side wall 23, the filter panels 31e, 32e and 33e form an arc-shaped cross section. The filter panel 32e may be positioned perpendicular to an air flowing direction as the air 3 entering the filtration member 30e, and the filter panels 31e and 33e are connected to two ends of the filter panel 32e and outwardly extend away from the filter panel 32e.

Figure 15:
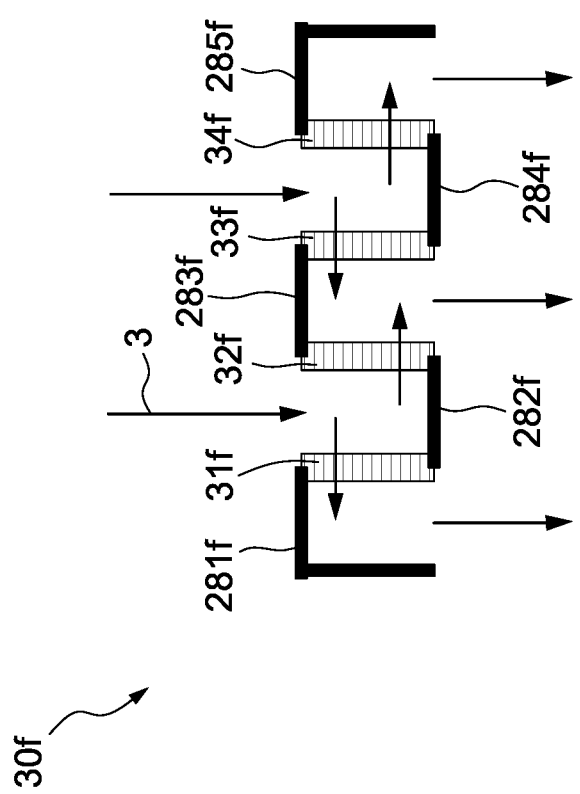
FIG. 15 is a cross-sectional view of a filter assembly with multiple filter panels and flow guiding members, in accordance with some embodiments of present disclosure.

FIG. 15 shows an embodiment of a filtration member 30f which includes a plurality of filter panels 31f, 32f, 33f and 34f, each including a number of hollow fibers as those in the filter panel 31 shown in FIG. 4 or as those in the filter panels 31a shown in FIG. 10. In addition, the filtration member 30f further includes a number of flow guiding members 281f, 282f, 283f, 284f and 285f. The filter panels 31f, 32f, 33f and 34f may be positioned parallel to an air flowing direction as the air 3 entering the filtration member 30f, and the flow guiding members 281f, 282f, 283f, 284f and 285f define a number of passages in the filtration member 30f to guide the air to pass through the filter panels 31f, 32f, 33f and 34f.

Embodiments of the present disclosure provide a method and a system for purifying air in a semiconductor fabrication building. The makeup air handling unit includes a number of hollow fibers which includes a porous layers as adsorbent to remove airborne molecular contamination having the number of carbon atoms less than 5. Since the pore size of the porous layer is intentionally selected according to the size of the molecules to be removed, the molecules can be firmly captured by the hollow fibers. Therefore, a concern that the semiconductor wafer in the fab would be contaminated by the airborne molecular contamination can be mitigated or avoided, and the product yield of the semiconductor wafer can be therefore improved.

According to one embodiment of the present disclosure, a semiconductor fabrication building is provided. The semiconductor fabrication building includes an ambient control surrounding and a makeup air handling unit. The makeup air handling unit is configured to supply clean air from an outside of the semiconductor fabrication building to the ambient control surrounding. The makeup air handling unit includes a housing having an air inlet and an air outlet. The makeup air handling unit further includes first filtration module positioned in the housing. The first filtration module includes a number of hollow fibers configured to guide air flowing from the air inlet to the air outlet. In addition, a porous layer is formed at an inner wall of each of the hollow fibers.

According to another embodiment of the present disclosure, a filtration module is provided. The filtration module includes a casing and a number of filter panels. The casing has a main axis and comprising two opposite side walls positioned at two sides of the main axis. The filter panels is positioned in the casing and each connected between the two opposite side walls. The filter panels includes a number of hollow fibers arranged in a matrix. Each of the hollow fibers includes a tubular body and a porous layer formed on an inner wall of the tubular body. The porous layer is configured to remove substances having the number of carbon atoms less than 5. In addition, the filter panels includes a bonding material connected between the tubular bodies for bonding the hollow fibers.

According to yet another embodiment of the present disclosure a method for purifying air in a semiconductor fabrication building is provided. The method includes collecting air from an outside of the semiconductor fabrication building to a housing of n makeup air handling unit through an air inlet. The method also includes guiding the air from the air inlet to flow through a plurality of hollow fibers positioned in the housing so as to trap substances by a porous layer formed at an inner wall of each of the hollow fibers. The method further includes directing the air to an ambient control surrounding of the semiconductor fabrication building through an air outlet of the housing after the air passes through the hollow fibers.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor fabrication building (FAB), comprising:
    an ambient control surrounding; and
    a makeup air handling unit configured to supply clean air from an outside of the semiconductor fabrication building to the ambient control surrounding, wherein the makeup air handling unit comprises:
    a housing having an air inlet and an air outlet; and
    a first filtration module positioned in the housing and comprising a plurality of hollow fibers configured to guide air to flow from the air inlet to the air outlet, wherein a porous layer is formed at an inner wall of each of the hollow fibers,
    wherein a pore size of the porous layer ranges from about 5 angstroms to about 6 angstroms.

2. The semiconductor fabrication building of claim 1, wherein each of the hollow fibers comprises one single gas channel, wherein the inner wall of each of the hollow fibers is defined in the gas channel and is covered with the porous layer.

3. The semiconductor fabrication building of claim 1, wherein each of the hollow fibers comprises a plurality of the gas channels, wherein the inner wall of each of the hollow fibers is defined in the gas channels and is covered with the porous layer.

4. The semiconductor fabrication building of claim 1, wherein each of the hollow fibers has a cylindrical shape and a bonding material is applied between the hollow fibers to block a gap formed between the hollow fibers.

5. The semiconductor fabrication building of claim 1, wherein the hollow fibers are inclined relative to an extension direction of the housing.

6. The semiconductor fabrication building of claim 1, wherein the makeup air handling unit further comprises a second filtration module positioned in the housing and located at downstream of the first filtration module, wherein the second filtration module comprises an activated carbon filter.

7. The semiconductor fabrication building of claim 1, wherein the makeup air handling unit further comprises:
    a fan positioned in the housing and located at upstream of the first filtration module; and
    a diffusion grid positioned between the fan and the first filtration module configured to evenly supply the air from the fan to the first filtration module.

8. A filtration module, comprising:
    a casing having a main axis and comprising two opposite side walls positioned at two sides of the main axis; and
    a plurality of filter panels positioned in the casing and each connected between the two opposite side walls, wherein each of the filter panels comprises:
    a plurality of hollow fibers arranged in a matrix and each comprising a tubular body, and a porous layer formed on an inner wall of the tubular body, wherein the porous layer is configured to remove substances having the number of carbon atoms less than 5; and
    a bonding material connected between the tubular bodies for bonding the hollow fibers.

9. The filtration module of claim 8, wherein the porous layer comprises a lattice structure having a pore size ranging from about 5 angstroms to about 6 angstroms.

10. The filtration module of claim 8, wherein the substances comprise methane, methanol (MeOH), isopropyl alcohol (IPA), acetone, n-butane, n-methyl-2-pyrrolidone (NMP), propylene glycol methyl ether (PGME), ethyl acetate or a combination thereof.

11. The filtration module of claim 8, wherein at least a portion of hollow fibers is arranged inclined relative to the main axis of the casing.

12. The filtration module of claim 8, wherein the hollow fibers in the respective filter panels are perpendicular to a plane in which the respective filter panels extend.

13. The filtration module of claim 8, wherein the filter panels are arranged in a V-shaped fashion or a U-shaped fashion as observed along a direction perpendicular to the side walls.

14. A method for purifying air in a semiconductor fabrication building, comprising:
    collecting air from an outside of the semiconductor fabrication building to a housing of a makeup air handling unit through an air inlet;
    guiding the air from the air inlet to flow through a plurality of hollow fibers positioned in the housing so as to trap substances by a porous layer formed at an inner wall of each of the hollow fibers; and
    directing the air to an ambient control surrounding of the semiconductor fabrication building through an air outlet of the housing after the air passes through the hollow fibers,
    wherein the substances are trapped by the porous layer having a pore size ranging from about 5 angstroms to about 6 angstroms.

15. The method of claim 14, wherein when the air flows through the hollow fibers, the porous layer is configured to trap substances having the number of carbon atoms less than 5.

16. The method of claim 14, wherein when the air passes through one of the hollow fibers, the air flows along a direction that is inclined relative to an extension direction of the housing.

17. The method of claim 14, further comprising guiding the air from the hollow fibers passing through an activated carbon filter before the air leaves the air outlet.

18. The method of claim 14, further comprising pumping the air in the housing through a fan and directing the air through a diffusion grid positioned between the fan and the hollow fibers to evenly supply the air from the fan to the hollow fibers.

19. The semiconductor fabrication building of claim 1, wherein the porous layer is configured to remove substances having the number of carbon atoms less than 5.

20. The method of claim 14, wherein when the hollow fibers are arranged in a panel positioned in the housing, and the air passes through a gas channel of each of the hollow fibers, the gas channels are perpendicular to the panel.

* * * * *